United States Patent [19]
Jean et al.

[11] Patent Number: 6,136,734
[45] Date of Patent: Oct. 24, 2000

[54] LOW-FIRE, LOW-DIELECTRIC CERAMIC COMPOSITIONS

[75] Inventors: Jau-Ho Jean; Shih-Chun Lin, both of Taipei, Taiwan

[73] Assignee: Advanced Ceramic X Corp., Taiwan

[21] Appl. No.: 09/330,047

[22] Filed: Jun. 11, 1999

Related U.S. Application Data

[63] Continuation of application No. 09/135,655, Aug. 18, 1998, abandoned.

[51] Int. Cl.$^7$ .............................. C03C 3/064; C03C 8/14; C03C 14/00
[52] U.S. Cl. ................................ 501/32; 501/17; 501/21
[58] Field of Search .................................. 501/17, 21, 32, 501/65, 72

[56] References Cited

U.S. PATENT DOCUMENTS

| | | | |
|---|---|---|---|
| 4,624,934 | 11/1986 | Kokubu et al. | 501/17 |
| 4,788,046 | 11/1988 | Barringer et al. | 501/32 |
| 5,242,867 | 9/1993 | Lin et al. | 501/32 |

*Primary Examiner*—Michael Marcheschi
*Attorney, Agent, or Firm*—Michael D. Bednarek; Shawpittman

[57] ABSTRACT

A low-fire, low-dielectric ceramic composition is disclosed. The ceramic composition comprises a mixture of finely divided particles consisting of 30–90% by volume of calcium borosilicate glass and 10–70% by volume of fillers consisting essentially of $Al_2O_3$ and amorphous $SiO_2$, which can be densified up to 95% at temperatures of 800–1000° C. The sintered body produced thereby exhibits a dielectric constant in the range of 6–9 and a dielectric loss in the range of 0.01%–0.5% at 1 MHz. The ceramic composition can be processed with organic solvent, polymeric binder and plasticizer to produce a green sheet which is co-firable with high electrical conductivity metal such as gold, silver, silver-palladium and copper.

3 Claims, No Drawings

LOW-FIRE, LOW-DIELECTRIC CERAMIC COMPOSITIONS

This is a continuation-in-part of Ser. No. 09/135,655, filed Aug. 18, 1998, now abandoned.

BACKGROUND OF THE INVENTION

1. Field of the Invention

The present invention relates in general to ceramic dielectric compositions. In particular, the invention relates to ceramic materials for multilayer ceramic devices such as multilayer ceramic circuit boards. The ceramic compositions can be sintered at low temperatures to produce dense bodies having low dielectric constants and low dielectric losses.

2. Description of the Related Arts

Recently, multilayer ceramic circuit boards have come into use for mounting integrated circuits to reduce the signal propagation delay.

Conventionally, alumina is generally used as an insulating material for a multilayer ceramic circuit board. One major drawback of the alumina multilayer ceramic circuit board is its greater signal delay, a result of the high dielectric constant of alumina (10 at 1 MHz). Furthermore, the sintering temperature of alumina is so high (1,600° C.) that a refractory metal such as tungsten or molybdenum must be used as the wiring conductor material for the multilayer ceramic circuit board. However, since the electrical resistivity of tungsten and molybdenum are comparatively high, these metals are not satisfactory for high speed integrated circuits.

Multilayer ceramic circuit boards using low-dielectric ceramic material have been developed to increase the electrical signal propagation speed as well as the reliability. In addition, the use of highly conductive metals such as gold, silver, and copper is effective for lowering the wiring conductor resistance. However, this requires the ceramic material to be sintered at a temperature below the melting points of these metals.

A method for producing multilayer ceramic circuit boards for use with copper conductors is described in U.S. Pat. No. 4,642,148 issued to Kurihara et al. There is disclosed a ceramic composition comprising 10–75% by weight of alpha-alumina, 5–70% by weight of non-crystalline quarts (fused silica), and 20–60% by weight of borosilicate glass. The sintered ceramic composition has a dielectric constant ranging from 4.8 to 9.6.

U.S. Pat. No. 4,672,152 issued to Shinohara et al. describes a multilayer ceramic circuit board in which a ceramic insulating layer is prepared from a mixture of 50–95% by weight of crystallized glass and 5–50% by weight of a ceramic filler. The sintered ceramic insulating layer has a dielectric constant between 5.1 and 6.0, and a flexural strength above 150 MPa. The crystallized glass consists of 5–20% by weight of lithium oxide, 60–90% by weight of silicon dioxide, 1–10% by weight of aluminum oxide, and 1–5% by weight of alkaline metal oxide other than lithium oxide. The ceramic filler is selected from the group consisting of silicon dioxide, β-eucryptite ($LiAlSiO_4$), and aluminum oxide.

U.S. Pat. No. 3,926,648 issued to Miller et al. discloses a sintered glass-ceramic body containing hexagonal cordierite as the crystalline phase. The glass composition exhibits a dielectric constant of 5.2 and a coefficient of thermal expansion between $1-2 \times 10^{-6} K^{-1}$.

U.S. Pat. No. 4,755,490 issued to DiLazzaro describes a low firing temperature ceramic material having a dielectric constant between 4.5 and 6.1 and a coefficient of thermal expansion between $3.9-4.2 \times 10^{-6}$ $K^{-1}$. The ceramic material is provided from a mixture of 10–50% by weight of alumina, 0–30% by weight of fused silica, and 50–60% by weight of a frit composed of 4% by weight of CaO, 12% by weight of MgO, 29% by weight of $B_2O_3$, and 42% by weight of $SiO_2$. The mixture has a minimum sintering temperature in the range of 850–1000° C.

U.S. Pat. No. 4,788,046 issued to Barringer et al. discloses glass-ceramic packages for integrated circuits by co-sintering a glass-ceramic composite and Cu, Ag, Pd, or Au at a low sintering temperature. The glass-ceramic composite is provided by coating glassy compounds onto ceramic particles. The composite with the lowest dielectric constant (4.5) is obtained by using quartz and borosilicate glass, which exhibits a thermal expansion coefficient greater than $5.5 \times 10^{-6} K^{-1}$.

U.S. Pat. No. 4,879,261 issued to Burn discloses a low dielectric composition for making a ceramic dielectric body having a dielectric constant less than 5.0. The composition is a mixture of finely divided particles consisting essentially of 70–85% by weight of silica and 15–30% by weight of zinc borate flux. The composition can be used to make green tape and multilayer devices having internal copper conductors such as multilayer capacitors and multilayer interconnects.

U.S. Pat. No. 4,654,095 issued to Steinberg describes a low firing temperature ceramic material having a dielectric constant between 6.5 and 8.1 and a coefficient of thermal expansion between $4.5-7.0 \times 10^{-6} K^{-1}$. The ceramic material is made of a mixture of 50–70% by weight of noncrystllizable glass, and 50–25% by weight of refractory oxides including alumina, mullite, cordierite, $CaZrO_3$, forsterite, $ZrO_2$ and mixtures. The mixture has a minimum sintering temperature in the range of 850–1000° C.

U.S. Pat. No. 4,655,864 issued to Rellick discloses a low firing temperature ceramic material having a dielectric constant between 6.5 and 8.1 and a coefficient of thermal expansion between $4.5-7.0 \times 10^{-6} K^{-1}$. The ceramic material is made of a mixture of 50–70% by weight of noncrystllizable lead calcium aluminum borosilicate glass, and 50–25% by weight of refractory oxides including alumina, alpha-quartz, fused silica, $CaZrO_3$, and mixtures. The noncrystllizable lead calcium aluminum borosilicate glass has a composition by weight of 56.5% $SiO_2$, 17.2% $PbO_2$, 9.1% $Al_2O_3$, 8.6% CaO, 4.5% $B_2O_3$, 2.4% NaO and 1.7% $K_2O$. The mixture has a minimum sintering temperature in the range of 850–1000° C.

U.S. Pat. No. 5,206,190 issued to Jean et al. discloses a low firing temperature ceramic material having a dielectric constant about 4.5 and a coefficient of thermal expansion between $2.5-4.0 \times 10^{-6} K^{-1}$. The ceramic material is made of a mixture of 40–50% by volume of noncrystllizable borosilicate glass, and 50–60% by volume of cordierite. The noncrystllizable borosilicate glass has a composition by weight of 60–80% $SiO_2$, 20–30% $B_2O_3$, 0.1–3% CaO, and 0.1–3% selected from the group of $K_2O$, $Na_2O$ and $Li_2O$ and mixture. The mixture has a minimum sintering temperature in the range of 850–950° C.

U.S. Pat. No. 5,260,119 issued to Jean et al. discloses a low firing temperature ceramic material having a dielectric constant about 4.2 and a coefficient of thermal expansion between $3-4 \times 10^{-6} K^{-1}$. The ceramic material is made of a mixture of 20–50% by weight of noncrystllizable borosilicate glass, and 25–75% by weight of high silica glass containing 95–98 wt % silica. The noncrystllizable borosilicate glass has a composition by weight of 60–80% $SiO_2$, 19–30% $B_2O_3$, 0.1–4% CaO, 0.1–4% $Al_2O_3$ and 0.1–4% selected from the group of $K_2O$, $Na_2O$ and $Li_2O$ and mixture. The high silica glass has a composition of 0–1 wt % $Al_2O_3$ and 3–5 wt % $B_2O_3$ and 95–98 wt % $SiO_2$. The mixture has a minimum sintering temperature in the range of 850–1000° C.

U.S. Pat. No. 5,786,288 issued to Jean discloses a low firing temperature ceramic material having a dielectric constant of 4.8–5.3 at 1 MHz and a linear thermal expansion coefficient of $4-5.1 \times 10^{-6} K^{-1}$ in the temperature range of 25–200° C. The ceramic material is made of a mixture of 10–90 wt % Mg—Al—Si glass, and 10–90 wt % Ca—Al—B—Si glass. The Mg—Al—Si glass which forms crystalline cordierite during sintering has a composition by weight of 15–25% MgO, 20–30% $Al_2O_3$ and 40–60% $SiO_2$. The Ca—Al—B—Si glass which forms crystalline feldspar during sintering has a composition of by weight of 15–25% CaO, 15–25% $Al_2O_3$, 5–15% $B_2O_3$ and 40–60% $SiO_2$. The mixture has a sintering temperature about 875° C.

U.S. Pat. No. 5,821,181 issued to Bethke et al. discloses a low firing temperature ceramic material having a dielectric constant between 7.5 and 10.0 and a high-Q of at least about 500. The ceramic material is made of a mixture of 30–70% by weight of glass, and 30–70% by weight of refractory oxides including alumina and at least one modifier selected from the group consisting of $TiO_2$, $SrTiO_3$ and $CaTiO_3$. The glass has a composition by weight of 35–67% $SiO_2$, 10–25% $B_2O_3$, 5–25% of at least one of MgO, CaO, SrO and BaO, and 2–10% of at least one of $K_2O$, $Na_2O$ and $Li_2O$. The mixture has a sintering temperature about 875° C.

SUMMARY OF THE INVENTION

It is an object of the invention to provide a low-fire ceramic composition having a dielectric constant below 9.0 as well as a low dielectric loss.

Another object of the invention is to provide a ceramic composition for dielectric devices that can be sintered at low temperatures between 800–1000° C. to form a dense body having a relative sintered density greater than 95%.

The invention also aims to provide a process for manufacturing ceramic articles. The ceramic articles produced thereby have a dielectric constant ranging from 6 to 9 and a dielectric loss ranging from 0.01% to 0.5% at 1 MHz.

According to an aspect of the invention, there is provided a ceramic dielectric composition containing 30–90% by volume of calcium borosilicate glass, and 70–10% by volume of fillers consisting essentially of $Al_2O_3$ and amorphous $SiO_2$. Preferably, the ceramic composition contains 40–60% by volume of calcium borosilicate glass, and 60–40% by volume of the fillers of $Al_2O_3$ and amorphous $SiO_2$.

The calcium borosilicate glass used in the invention is regarded as glass phase, which has a softening temperature between 600 and 800° C. The term "glass" is used herein to describe ceramic compositions that melt and form glassy phase at a temperature below 1000° C. The term "calcium borosilicate glass" is used herein to describe a family of glasses containing 35–45 wt % CaO, 15–20 wt % $B_2O_3$, and 35–50 wt % $SiO_2$. A preferred calcium borosilicate glass comprises about 39.6 wt % CaO, 18.8 wt % $B_2O_3$, and 41.6 wt % $SiO_2$.

The oxide fillers used in the invention are regarded as ceramic phase. The term "ceramic" is used herein to describe inorganic compositions that will soften only at a temperature exceeding 1000° C. The fillers used herein are preferably composed of 25–75 vol % $Al_2O_3$ and 75–25 vol % amorphous $SiO_2$. Fillers suitable for use in the invention also include mullite, anortite, cordierite, $TiO_2$, $CaTiO_3$, $(Ca,Sr)TiO_3$ and the mixture.

According to another aspect of the invention, there is provided a process for manufacturing a ceramic article characterized by using the above described ceramic compositions. The process comprises the steps of: (a) providing a powder mixture consisting essentially of finely divided particles of 30–90% by volume of calcium borosilicate glass and 70–10% by volume of fillers consisting essentially of $Al_2O_3$ and amorphous $SiO_2$; (b) sintering the mixture at a temperature of 850–1000° C. for 15–60 minutes in air. The term "finely divided" is used herein to describe materials that are ground to less than 5 microns in size. The ceramic article produced thereby exhibits a dielectric constant of 6–9 and a dielectric loss of 0.01–0.5% at 1 MHz.

The ceramic composition of the invention can be applied to the manufacture of multilayer ceramic substrates or devices. For example, the composition can be fabricated into a multilayer ceramic device by the following procedures: (a) preparing a slurry of (i) 70–85% by weight of a ceramic composition composed of 30–90% by volume of calcium borosilicate glass and 70–10% by volume of fillers consisting essentially of $Al_2O_3$ and amorphous $SiO_2$, and (ii) 30–15% by weight of organic carriers including an organic binder; (b) casting the slurry to form a green sheet; (c) printing conductive pastes onto the green sheet; (d) laminating together a plurality of printed green sheets to form a multilayer ceramic green compact; (e) subjecting the multilayer ceramic green compact to binder burnout; and (f) sintering the substantially binder free multilayer ceramic green compact in air.

Without intending to limit it in any manner, the present invention will be further illustrated by the following examples. In each example, the calcium borosilicate glass is comprised of 39.6 wt % CaO, 18.8 wt % $B_2O_3$, and 41.6 wt % $SiO_2$.

EXAMPLE 1

625 g of calcium borosilicate glass powder and 775 cm³ of 2-propyl alcohol were blended and milled in a 5-liter ball mill with 5,000 g of alumina balls. The resulting slurry was sieved with a sieve of 325 mesh and dried in an oven at 80° C. for 16 hours. The dried lumps were crushed and ground with pestle and mortar to give a particle size ranging from 1 to 5 $\mu$m. X-ray diffraction analysis indicated that the resulting powder was amorphous.

Green compacts of sample Nos. 1A–1I were prepared by the following procedures. A powder mixture was prepared by mixing a finely divided powder consisting of 40 vol % calcium borosilicate glass, 30 vol % $Al_2O_3$ and 30 vol % amorphous $SiO_2$. The $Al_2O_3$ used here had a particle size of 0.6–5.0 $\mu$m, while the amorphous $SiO_2$ had a particle size of 3–5 $\mu$m. The powder mixture was blended with 5 wt % of polyethylene glycol binder and 50 wt % of 1-propyl alcohol through a 3-dimension mixer for 2 hours. The slurry was dried and sieved into dry powders, which were then dry pressed into green compacts of 0.3 cm in height and 1.3 cm in diameter under a pressure of 13,000 psi.

Subsequently, green compacts 1A–1C, 1D–1F, and 1G–1I were sintered in air at temperatures of 850° C., 875° C., and 900° C., respectively. The green compacts were heated to 500° C. with a heating rate of 5° C./min and maintained at the temperature for one hour to remove the binder completely. The samples were then fired at a heating rate of 5° C./min up to the sintering temperatures, and the soaking periods were in the range of 15–60 minutes. The sintering conditions are tabulated in Table 1.

Relative sintered densities of the densified samples were measured by the water displacement method and the results are shown in Table 1. All of the tested specimens reached a relative density of above or near 95% except sample No. 1A. Such results were also confirmed by analyzing the fracture surface of the sintered bodies using scanning electron microscopy. The dielectric properties of the sintered bodies listed in Table 1 were measured at 1 MHz. It is found that the sintered bodies exhibited dielectric constants ranging from 7.16–7.63 and dielectric losses ranging from 0.04% to 0.11%. Moreover, thermal expansion results showed that all the tested samples except sample No. 1A have a thermal expansion coefficient in the range of $4-5\times10^{-6}K^{-1}$ at 25–200° C.

EXAMPLE 2

Green compacts of sample Nos. 2A–2I, containing 60 vol % calcium borosilicate glass, 30 vol % $Al_2O_3$ and 10 vol % amorphous $SiO_2$., were prepared by the same procedures as in Example 1. Green compacts 2A–2I were then subjected to the same procedures of binder burnout and sintering as green compacts 1A–1I as in Example 1. The relative densities and dielectric properties of the sintered bodies as well as the sintering conditions are listed in Table 1. All of the tested specimens reached a relative density of above or near 95% except sample No. 2I. Such results were also confirmed by analyzing the fracture surface of the sintered bodies using scanning electron microscopy. The sintered bodies thus obtained had dielectric constants ranging from 7.45 to 7.80 and dielectric losses ranging from 0.04% to 0.23% at 1 MHz. Moreover, thermal expansion results showed that all the tested samples except sample No. 2I have a thermal expansion coefficient in the range of $4-5\times10^{-6}K^{-1}$ at 25–200° C.

TABLE 1

| Sample No. | Sintering temperature (° C.) | Sintering time (min) | Relative sintered density (%) | dielectric constant (@ 1 MHz) | dielectric loss (%) (@ 1 MHz) |
| --- | --- | --- | --- | --- | --- |
| 1A | 850 | 15 | 92.35 | x | x |
| 1B | 850 | 30 | 94.97 | 7.16 | 0.11 |
| 1C | 850 | 60 | 95.52 | 7.35 | 0.06 |
| 1D | 875 | 15 | 96.00 | 7.35 | 0.08 |
| 1E | 875 | 30 | 95.47 | 7.44 | 0.07 |
| 1F | 875 | 60 | 95.31 | 7.40 | 0.08 |
| 1G | 900 | 15 | 95.56 | 7.40 | 0.08 |
| 1H | 900 | 30 | 95.25 | 7.63 | 0.04 |
| 1I | 900 | 60 | 95.67 | 7.51 | 0.11 |
| 2A | 850 | 15 | 96.66 | 7.78 | 0.04 |
| 2B | 850 | 30 | 95.47 | 7.79 | 0.07 |
| 2C | 850 | 60 | 95.29 | 7.70 | 0.05 |
| 2D | 875 | 15 | 94.59 | 7.80 | 0.08 |
| 2E | 875 | 30 | 94.71 | 7.65 | 0.08 |
| 2F | 875 | 60 | 94.34 | 7.62 | 0.11 |
| 2G | 900 | 15 | 94.77 | 7.70 | 0.17 |
| 2H | 900 | 30 | 94.42 | 7.63 | 0.13 |
| 2I | 900 | 60 | 93.76 | 7.45 | 0.23 |

OTHER EMBODIMENTS

The low-fire feature (850–900° C.) of the ceramic compositions of the invention enables them to be co-fired with low-melting-point wiring conductor such as gold and silver to produce multilayer ceramic devices.

The ceramic compositions of the above examples can be co-fired with high electrical conductivity metallurgy such as silver to produce multilayer ceramic devices as follows. First, a slurry is prepared by incorporating 70–85 wt % of the above-described ceramic composition and 30–15 wt % of organic carriers including organic solvents such as toluene and ethanol, organic binders such as polyvinyl butyral (PVB), and organic plasticizers such as dibutyl phthalate (DBP). The slurry is cast into thin green sheets having a thickness of about 125 μm using doctor blade. The green sheets are blanked into square sheets of 100×100 mm, and via holes are formed therein by die punching. The via holes preferably have a diameter of about 125 μm. A conductive paste such as Ag or Au paste is applied to the punched sheets in a desired pattern using a screen printing process. The paste is also applied within the via holes so as to form interconnects between conductor patterns. The printed green sheets are stacked in registry and laminated together at 60–100° C. under a pressure of 1000–3000 psi. Finally, the laminated green sheets are fired at a temperature not exceeding 1000° C. to produce a ceramic multilayer circuit substrate.

The compositions of the present invention also can be fabricated into rigid, nonporous ceramic bodies by substantially conventional techniques. For example, the ingredients of any of the previous examples are blended with water and organic binders and ball milled for a period of about 20 hours. The resulting slurry is spray dried to give a powder of substantially spherical particles. This powder can be compressed into bodies of desired shapes by dry pressing or isostatic pressing. The bodies are then fired at a suitable temperature not exceeding 1000° C. to provide dense, sintered ceramic articles.

What is claimed is:

1. A ceramic dielectric composition comprising: (a) 30–90% by volume of calcium borosilicate glass comprising 35–45% by weight of CaO, 15–20% by weight of $B_2O_3$, and 35–50% by weight of $SiO_2$; and (b) 70–10% by volume of fillers, said fillers consisting essentially of $Al_2O_3$ and amorphous $SiO_2$.

2. The ceramic dielectric composition as claimed in claim 1, wherein said calcium borosilicate glass consists essentially of 39.6 wt % CaO, 18.8 wt % $B_2O_3$, and 41.6 wt % $SiO_2$.

3. The ceramic dielectric composition as claimed in claim 1, wherein said fillers consist of 25–75% by volume of $Al_2O_3$ and 75–25% by volume of amorphous $SiO_2$.

* * * * *